United States Patent
Sasaki et al.

(10) Patent No.: US 7,531,370 B2
(45) Date of Patent: May 12, 2009

(54) LIGHT-EMITTING DIODE AND ITS MANUFACTURING METHOD

(75) Inventors: Kazuaki Sasaki, Osaka (JP); Junichi Nakamura, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 285 days.

(21) Appl. No.: 11/256,001

(22) Filed: Oct. 24, 2005

(65) Prior Publication Data

US 2006/0038186 A1 Feb. 23, 2006

Related U.S. Application Data

(62) Division of application No. 10/851,249, filed on May 24, 2004, now Pat. No. 7,075,120.

(30) Foreign Application Priority Data

May 27, 2003 (JP) .............................. 2003-148666

(51) Int. Cl.
    *H01L 21/00* (2006.01)
(52) U.S. Cl. ........................... 438/22; 438/47; 438/937; 257/79; 257/102; 257/103; 257/E33.023
(58) Field of Classification Search ................... 438/22, 438/23; 257/E33.016, E33.023, E33.031
    See application file for complete search history.

(56) References Cited

U.S. PATENT DOCUMENTS

| 5,008,718 | A | 4/1991 | Fletcher et al. |
| 6,433,364 | B2 | 8/2002 | Hosoba et al. |
| 6,468,818 | B2 * | 10/2002 | Nakamura et al. ............. 438/22 |
| 6,727,109 | B2 * | 4/2004 | Ju et al. ......................... 438/22 |
| 2001/0050530 | A1 | 12/2001 | Murakami et al. |

FOREIGN PATENT DOCUMENTS

| JP | 4-229665 | 8/1992 |
| JP | 6-103759 | 12/1994 |
| JP | 11-17218 | 1/1999 |
| JP | 2000-058908 | 2/2000 |
| JP | 2000-196138 | 7/2000 |
| JP | 2002-280606 | 9/2002 |

OTHER PUBLICATIONS

Japanese Office Action issued on Jul. 1, 2008 directed towards counterpart foreign application No. 2003-148666; 2 pages.

* cited by examiner

*Primary Examiner*—Michael S. Lebentritt
*Assistant Examiner*—Daniel Whalen
(74) *Attorney, Agent, or Firm*—Morrison & Foerster, LLP

(57) ABSTRACT

It is an object of the present invention to provides the light emitting diode having a light emitting part of an AlGaInP type, and having a current diffusion layer which includes In on a light emitting side of the light emitting part, so that the generation of hillocks is effectively inhibited and the brightness of the light emitting diode is increased.

3 Claims, 9 Drawing Sheets

Carrier Density of Current Diffusion
Layer at High Density (×E19/cm$^3$)

Carrier Density of Current Diffusion
Layer at High Density (×E19/cm$^3$)

US 7,531,370 B2

LIGHT-EMITTING DIODE AND ITS MANUFACTURING METHOD

REFERENCE TO RELATED APPLICATION

This application is a divisional of Ser. No. 10/851,249, filed May 24, 2004, which claims priority to Japanese Patent Application No. 2003-148666, filed May 23, 2003.

This non-provisional application claims priority under 35 U.S.C. §199(a) on Patent Application No. 2003-148666 filed in Japan on May 27, 2003, the entire contents of which are hereby incorporated by reference.

TECHNICAL FIELD

This invention relates to an AlGaInP based light-emitting diode, i.e. LED, having a (electric) current diffusion layer, and relates to its manufacturing method.

BACKGROUND ART

Recently, an LED comes into noteworthy display element, employed indoors and outdoors. With an increasing of a brightness of the LED, a demand for the LED has been increasing rapidly in display market, as an alternative device to neon lamp.

As an LED emits visible high-brightness light, an AlGaInP based DH-type LED has been known. FIG. 10 is a structural diagram of the AlGaInP based LED 100 (hereinafter, referred to as a first conventional embodiment) disclosed in JPB.H06-103759.

The LED 100 is manufactured by processing the following steps. As a first step, by using of MOCVD method, a n-AlGaInP clad layer 2 (thickness of 1.0 μm, Si-dope: $5 \times 10^{17}$ cm$^{-3}$), a $(Al_{0.3}Ga_{0.7})_{0.5}In_{0.5}P$ active layer 3 (thickness of 0.6 μm), a p-AlGaInP clad layer 4 (thickness of 0.7 μm, Zn dope: $5 \times 10^{17}$ cm$^{-3}$), a p-AlGaAs (electric) current diffusion layer 5 (thickness of 6.0 μm, Zn dope: $3 \times 10^{18}$ cm$^{-3}$) and a p-GaAs cap layer 6 (thickness of 0.02 μm, Zn dope: $1 \times 10^{18}$ cm$^{-3}$) are orderly grown on a n-GaAs substrate 1. And then, an electrode 9 is formed on the whole surface of the n-GaAs substrate 1, and an electrode 12 is formed on the p-GaAs cap layer 6. The outer region of a central circle portion of the p-GaAs cap layer 6 and the electrode 12 are removed by etching method.

The n-AlGaInP clad layer 2, the active layer 3 and the p-AlGaInP clad layer 4 of the LED 100 constitute the illumination part (or a light emitting part) 50. A PN junction is formed on the active layer 3. A bright light radiates from an electron—hole re-coupling phenomenon caused at the PN junction. When a (electric) current (20 mA) is supplied to the LED 100 covered by a cylindrical plastic package (diameter of 5 mm), the LED 100 luminous at 1.0 candela (described below 1.0 cd).

FIG. 11 is a structural diagram of AlGaInP based LED 200 (hereinafter, referred to as a second conventional embodiment) described in JPA.H04-229665.

The LED 200 is manufactured by processing the following steps. At a first step, by using of MOCVD method, an illumination part (or a light emitting part) which is composed of an n-AlGaInP clad layer 12 (thickness of 1.0 μm, Si dope: $5 \times 10^{17}$ cm$^{-3}$), a $(Al_{0.3}Ga_{0.7})_{0.5}In_{0.5}P$ active layer 13 (thickness of 0.6 μm) and a p-AlGaInP clad layer 14 (thickness of 0.7 μm, Zn dope: $5 \times 10^{17}$ cm$^{-3}$), are orderly grown on the n-GaAs substrate 11. As a second step, a p-GaInP cap layer 15 is formed on the layer 14. As a third step, a n-AlGaInP (electric) current inhibiting layer 16 (thickness of 0.3 μm, Si dope: $3 \times 10^{18}$ cm$^{-3}$) is formed on a center part of the layer 15, and then the outer region of a central circle portion of the layer 16 removed by etching method. As a fourth step, a p-AlGaAs (electric) current diffusion layer 17 (thickness of 6.0 μm, Zn dope: $3 \times 10^{18}$ cm$^{-3}$) and p-GaAs cap layer (i.e. contact layer) 18 (thickness of 0.02 μm, Zn dope: $1 \times 10^{18}$ cm$^{-3}$) are orderly grown on the p-GaInP cap layer 15 and the n-AlGaInP current inhibiting layer 16. As a fifth step, an electrode 21 is formed over all the n-GaAs substrate 11, and the other electrode 22 is formed on the layer 18. Then the outer region of a central circle portion both of the p-GaAs cap layer 18 and the electrode 22 are removed by etching method.

As explained above, the n-AlGaInP clad layer 12, the active layer 13, the p-AlGaInP clad layer 14 and the p-GaInP cap layer 15 constitute an illumination part (or the light emitting part) 60 of the LED 200. The light generated at the illumination part, is radiated from around the n-AlGaInP current inhibiting layer 16. Therefore, the amount of light reaching the underside of the electrode 22 is reduced, and the efficiency to take out the light from the body of the LED 200 is increased. That is, a total power of an out-leading light from the body of the LED 200 is increased, i.e., a brightness of the LED 200 is increased. When a (electric) current of 20 mA is supplied to the LED 200 molded in a cylindrical plastic package having a diameter of 5 mm, the brightness of the LED 200 is 1.8 cd.

Each of the LED 100 of the first conventional embodiment, and the LED 200 of the second conventional embodiment, has crystal defects called as hillocks which exist at a density of about 40,000 pieces/cm$^2$. The hillocks reduce brightness because of absorbing the light and make an optical recognition of the electrode 12, 22 difficult so that it gives some trouble to its auto wire-bonding operation.

SUMMARY OF THE INVENTION

Therefore, it is an object of the present invention to provide a high brightness LED, in which the generating of hillocks are effectively inhibited.

It is another abject of the present invention to provide a method for manufacturing the high brightness LED.

In accomplishing these and other objects of the present invention, according to one aspect of thereof, there is provided a first LED which comprises a light emitting part of an AlGaInP type and a (electric) current diffusion layer which includes In on a light emitting side of the light emitting part.

In accomplishing the above objects of the present invention, according to another aspect thereof, there is provided a second LED which is a diode as the first LED, wherein the current diffusion layer includes AlGaInAs.

In accomplishing the above objects of the present invention, according to another aspect thereof, there is provided a third LED which is a diode as the second LED, wherein a composition rate of In included in the AlGaInAs to all elements belonging to III group is 1-10%.

In accomplishing the above objects of the present invention, according to another aspect thereof, there is provided a fourth LED which is a diode as the second LED, wherein the current diffusion layer is constructed by a double-layered structure which includes a lower layer and an upper layer, and a carrier density of the lower layer is smaller than carrier density of the upper layer.

In accomplishing the above objects of the present invention, according to another aspect thereof, there is provided a fifth LED which is a diode as the third LED, wherein the current diffusion layer is constructed by a double-layered structure which included a lower layer and an upper layer, and a carrier density of the lower layer is smaller than carrier density of the upper layer.

In accomplishing the above objects of the present invention, according to another aspect thereof, there is provided a sixth LED which is a diode as the fourth LED, wherein the carrier density of the lower layer is in a region from $0.5 \times 10^{18}$ to $3 \times 10^{18}$ cm$^{-3}$ and the carrier density of the upper layer is in a region $0.3 \times 10^{19}$ to $2 \times 10^{19}$ cm$^{-3}$.

In accomplishing the above objects of the present invention, according to another aspect thereof, there is provided a seventh LED which is a diode as the fifth LED, wherein the carrier density of the lower layer is in a region from $5 \times 10^{18}$ to $3 \times 10^{18}$ cm$^{-3}$ and the carrier density of the upper layer is in a region $0.3 \times 10^{19}$ to $2 \times 10^{19}$ cm$^{-3}$.

In accomplishing the above objects of the present invention, according to another aspect thereof, there is provided a eighth LED which is a diode as the first LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a ninth LED which is a diode as the second LED, a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a tenth LED which is a diode as the third LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a eleventh LED which is a diode as the fourth LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a twelfth LED which is a diode as the fifth LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a thirteenth LED which is a diode as the sixth LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a fourteenth LED which is a diode as the seventh LED, further comprising; a (electric) current inhibiting layer made of GaInP, wherein the current inhibiting layer is circularly formed in center portion between the emitting part and the current diffusion layer.

In accomplishing the above objects of the present invention, according to another aspect thereof, there is provided a fifteenth LED which is a diode as the first LED, further comprising; a (electric) current stenosis layer (or a (electric) current narrowing layer) is removed its central circle portion, and is formed between the emitting part and the current diffusion layer.

In accomplishing the above objects of the present invention, according to another aspect thereof, there is provided a first method for manufacturing a LED having a light emitting part of an AlGaInP type, the method comprising a step of forming a (electric) current diffusion layer made of AlGaInAs on a light emitting side of the light emitting part.

In accomplishing the above objects of the present invention, according to another aspect thereof, there is provided a second method for manufacturing the LED which is a method for manufacturing diode as the first method, wherein the current diffusion layer is formed at a growth rate which is not more than 1.2 μm/h, at least in an initial stage for the step.

In accomplishing the above objects of the present invention, according to another aspect thereof, there is provided a third method for manufacturing the LED which is a method for manufacturing diode as the second method, wherein the current diffusion layer is formed at a growth rate which is not more than 1.2 μm/h, until a thickness of the current diffusion layer comes to over 0.1 μm.

BRIEF DESCRIPTION OF DRAWINGS

These objects described above and other objects and their features of the present invention will become clear from the following description taken in conjunction with preferred embodiments thereof with reference to the accompanying drawings.

DISCLOSURE OF INVENTION (1) First Embodiment

Figure 10:
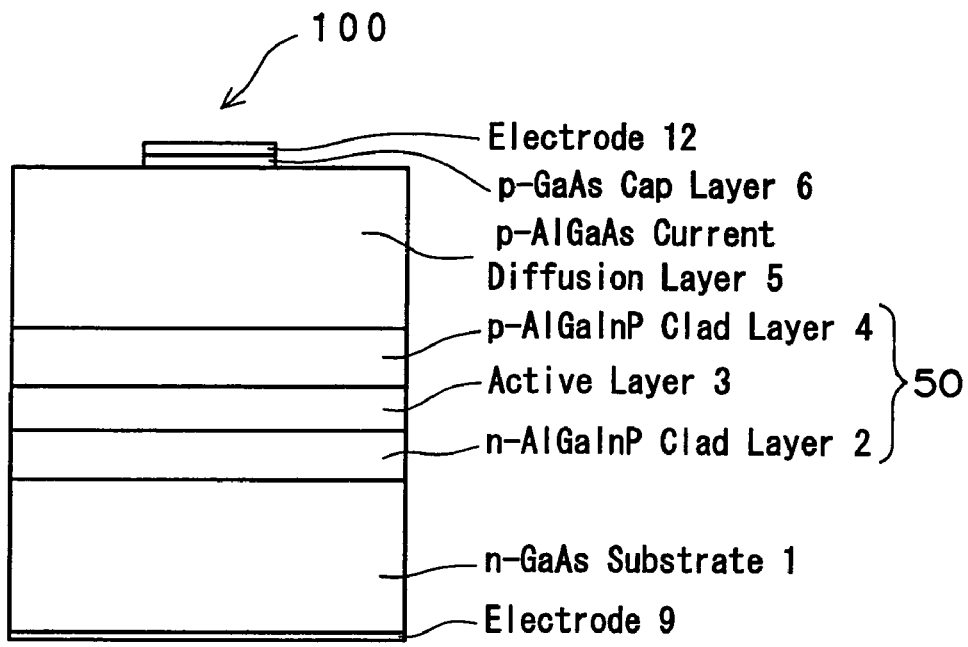
FIG. 10 is a schematic view showing a structure of the LED according to a first conventional embodiment.
Figure 11:
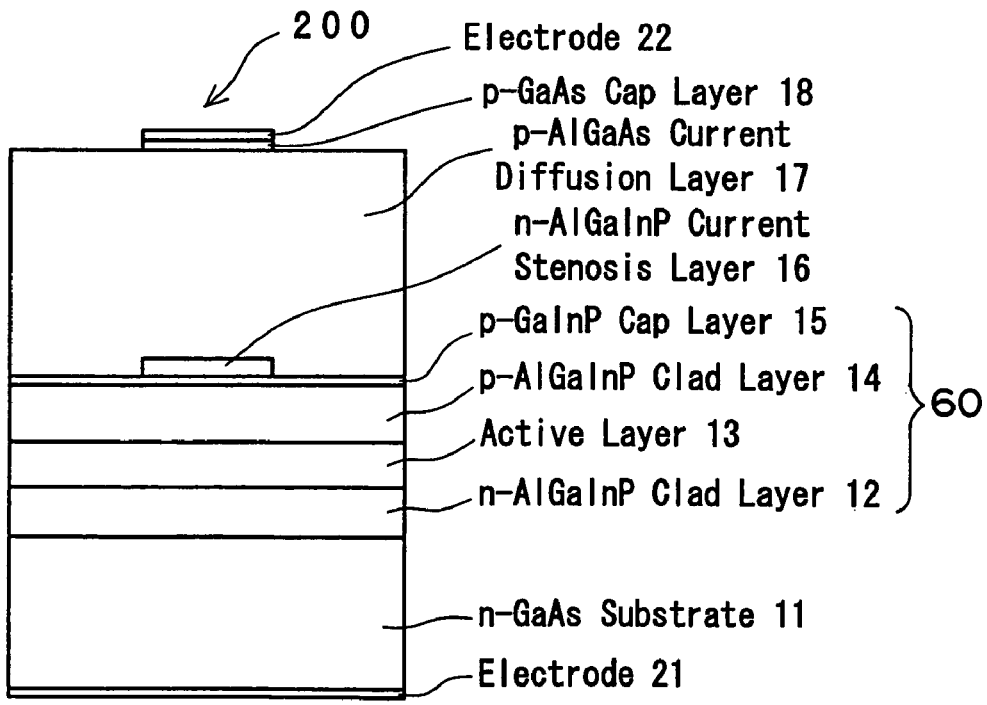
FIG. 11 is a schematic view showing a structure of the LED according to a second conventional embodiment.

The inventor finds out the fact that the hillocks of the LED 100 (see FIG. 10) which has been described in the column of the aforementioned "BACKGROUND ART", are generated between the p-AlGaInP clad layer 4 and the p-AlGaAs current diffusion layer 5. This result is lead out from the fact that when the p-GaAs cap layer 6 and the p-AlGaAs current diffusion layer 5 of the LED 100 are completely removed out by etching method, the hillocks completely disappear, and from the fact that when a small area of the p-AlGaAs current diffusion layer 5 remains, the hillocks never disappear. Similarly, the inventor finds out a fact that the hillocks of the LED 200 (see FIG. 11) which has been described in the column of the prior art, are generated between the p-GaInP cap layer 15 and the p-AlGaAs current diffusion layer 17.

Also, analyzing the chemical composition of the p-AlGaAs current diffusion layer 5 having a thickness up to 0.1 μm in the initial phase, or stage, of growth, of the LED 100, the p-AlGaAs current diffusion layer 5 was found to contain about 0.5%-1.0% of In which had not been added thereto intentionally. This element of In seems to be diffused from the p-AlGaInP clad layer 4 locating under the p-AlGaAs current diffusion layer, and the hillocks seems to be generated with the element of In being nucleus.

Based upon these facts, the inventor provides a LED 110 (see FIG. 1) with a p-AlGaInAs current diffusion layer including In (i.e. indium) in which the LED 110 has an illumination part (or light emitting part) of an AlGaInP type. The LED 110 can reduce the number of hillocks on its wafer substrate by at least more than one digit than that of the conventional LED 100, 200, thus realizing a satisfactory brightness of its light.

With reference to FIGS. 1 through 9, a description is made below upon the LED (110,120,210,220) according to each of the first through fourth embodiments of the present invention, in detail.

Firstly, with reference to FIGS. 1 through 4B, it is explained about the LED 110 according to the first embodiment.

Figure 1:
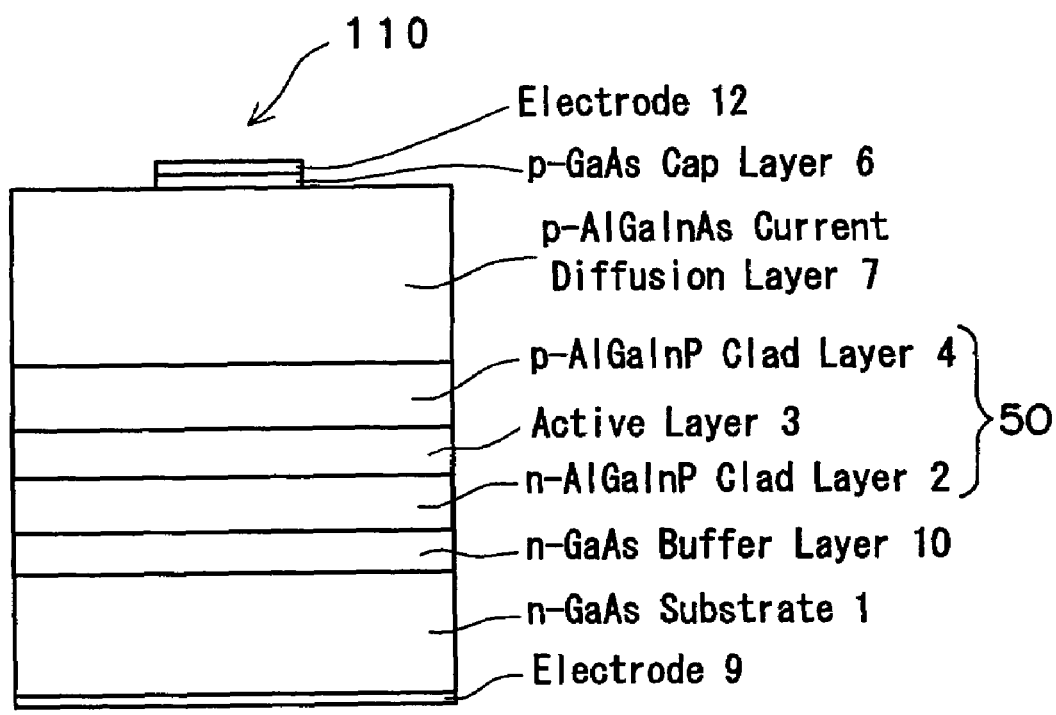
FIG. 1 is a schematic view showing a structure of an LED according to a first embodiment of the present invention.

FIG. 1 is a cross-sectional view showing the LED 110 of the first embodiment. The same components of the LED 110 as those of the LED 100 according to the first conventional embodiment, are designated by the same reference numeral throughout the drawings.

The LED 110 is manufactured below steps. At first step, by using of MOCVD method, a n-GaAs buffer layer 10 (thickness of 0.5 μm, Si dope: $5 \times 10^{17}$ cm$^{-3}$), the n-(Al$_{0.7}$Ga$_{0.3}$)$_{0.5}$In$_{0.5}$P clad layer 2 (thickness of 1.0 μm, Si dope: $5 \times 10^{17}$ cm$^{-3}$), the undope (Al$_{00.3}$Ga$_{0.7}$)$_{0.5}$In$_{0.5}$P active layer 3 (thickness of 0.6 μm), the p-(Al$_{0.7}$Ga$_{0.3}$)$_{0.5}$In$_{0.5}$P clad layer 4 (thickness of 0.7 μm, Zn dope: $5 \times 10^{17}$ cm$^{-3}$), a p-AlGaInAs current diffusion layer 7 (thickness 6 μm, Zn dope: $3 \times 10^{18}$ cm$^{-3}$) and the p-GaAs cap layer 6 (thickness 0.01 μm, Zn dope: $1 \times 10^{18}$ cm$^{-3}$) are orderly grown on the n-GaAs substrate 1. A composition rate of In of the current diffusion layer 7 to all of III group (i.e. alkaline earth metal group) is set to be 2%.

The n-AlGaInP clad layer 2, the active layer 3 and the p-AlGaInP clad layer 4 constitute the illumination part (or a light emitting part) 50. A PN junction is formed on the active layer 3. A bright light radiates from an electron—hole re-coupling phenomenon caused at the PN junction.

The current diffusion layer 7 is grown at a growth rate of 1 μm/h up to a thickness of 0.13 μm, and then the layer 7 is grown at a growth rate of 2 μm/h until the formation of the current diffusion layer 7 is finished. An electrode 9 is formed on the n-GaAs substrate 1 and the electrodes 12 is formed on the p-GaAs cap layer 6, respectively. Each of the electrode 12 and p-GaAs cap layer 6 is partially removed by etching method, so as to leave a central region (φ=100 μm) thereof for its bonding pad.

The number of hillocks of the LED 110 having been manufactured through the above steps, is about 4000 (piece/cm$^2$) on a surface of its wafer. Namely, the number of hillocks of the LED 110 becomes one-tenth of that of the LED 100 according to the first conventional embodiment (see FIG. 10). The content of In which is included in the current diffusion layer 7 having a thickness of 0.1 μm of the LED 110 during its growth, is 2.1%. This amount of In is almost the same amount (2.0%) as that designed beforehand, and it is to be noted that the diffusion of the element, In, from the cladding layer 4 is effectively inhibited or prevented.

When a (electric) current of 20 mA is supplied to the LED 110 being molded in a cylindrical plastic package (diameter of 5 mm), the LED 110 emits a bright light at. 2.0 cd, the value of which is twice as high as that of the conventional LED 100.

Figure 2A:
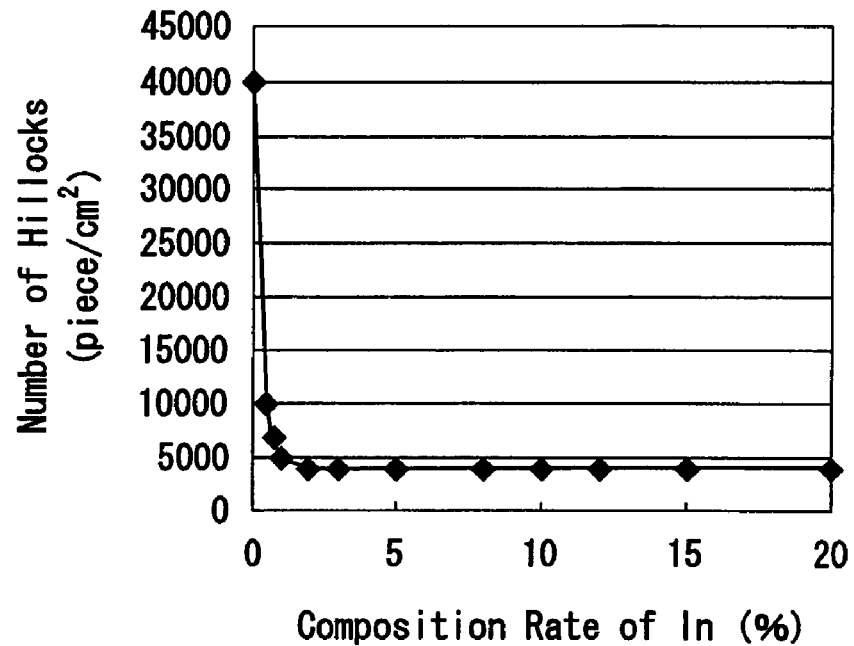
FIG. 2A is a graph showing a relation between the compositional rate of In included in a (electric) current diffusion layer of the LED of FIG. 1, and the number of hillocks therein.
Figure 2B:
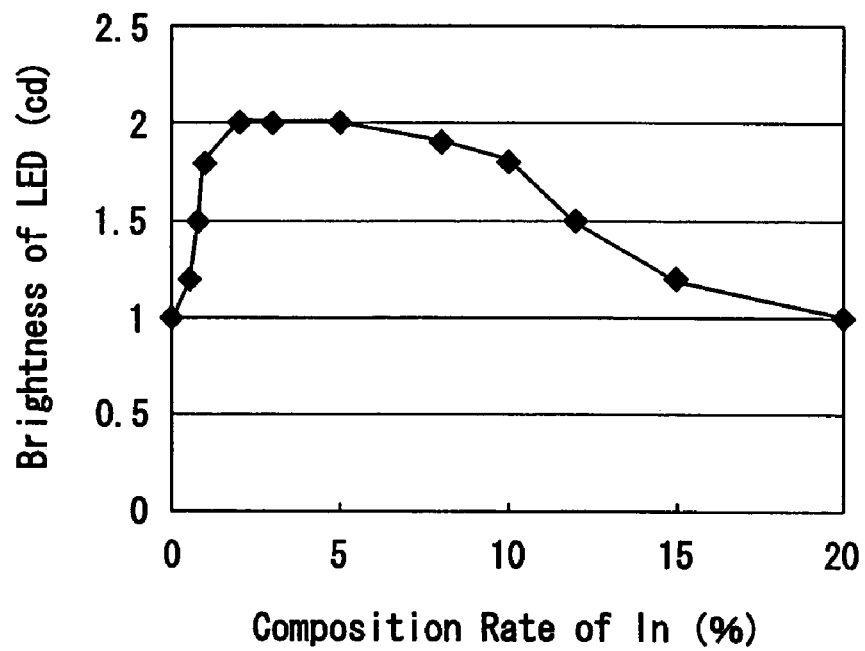
FIG. 2B is a graph showing a relation between the compositional rate of In included in a (electric) current diffusion layer of the LED of FIG. 1, and the brightness of the LED thereof.

FIG. 2A is a graph showing a relation between the content (%) of In which is included in the current diffusion layer 7, and the number of hillocks (pieces/cm$^2$), when the content (%) of In varies within a region from 0% to 20% with respect to all the elements belonging to the III group (i.e. alkaline earth metal group). Also, FIG. 2B is a graph showing a relation between the content (%) of In which is included in the current diffusion layer 7, and the brightness (cd) of the light emission, when the content (%) of In varies within the same region. In order to recognize the electrode automatically for an automatic wire-bonding operation, the number of hillocks is preferably equal to or less than 5,000 (pieces/cm$^2$). From these two graphs of FIG. 2A and FIG. 2B, it is understandable that the content of In so as to satisfy the requirement for limiting the number of hillocks and so as to realize the light intensity (or brightness) which is equal to or more than 1.8 cd corresponding to 90% of the maximum value 2.0 cd, is 1-10%.

As shown in FIG. 2A, when the density rate of In is less than 1%, the number of the hillocks increases rapidly. This seems to be because the diffusion of In from the clad layer 4 into the p-AlGaInAs current diffusion layer 7 can not to be blocked fully.

Also, as shown in FIG. 2B, when the density rate of In is higher than 10%, the light intensity of emission decreases. This seems to be because the grid distortion of the crystal of the clad layer 4 occurs.

In case that the current diffusion layer 7 is grown at a growth rate of 0.8 μm/h up to the thickness of 0.2 μm, the number of hillocks can be decreased into 3,000 (piece/cm$^2$) and a light intensity of the LED 110 is improved up to 2.1 cd. This seems to be because a deceleration of the growing speed affects a refinement of a crystalline and a decreasing of a light loss.

Figure 3A:
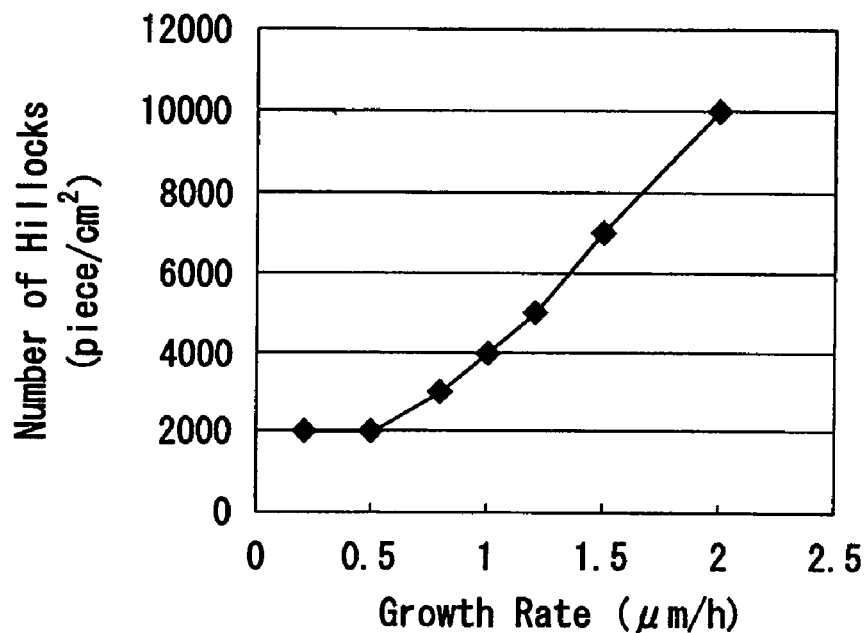
FIG. 3A is a graph showing a relation between an initial growth rate of the current diffusion layer of the LED of FIG. 1, and the number of hillocks.
Figure 3B:
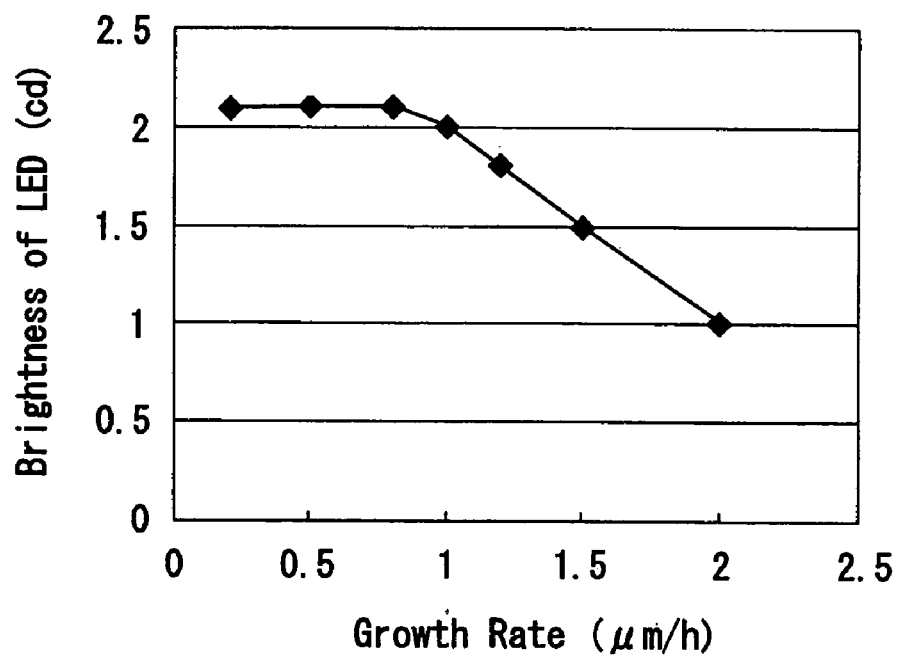
FIG. 3B is a graph showing a relation between the initial growth rate of the current diffusion layer of the LED of FIG. 1, and the brightness of the LED thereof.

FIG. 3A is a graph showing a relation between the growth rate (μm/h) of the current diffusion layer 7 until the thickness of the layer 7 reaches 0.2 μm, and the number of hillocks (piece/cm$^2$). FIG. 3B is a graph showing a relation between the growth rate (μm/h) of the current diffusion layer 7 until the thickness of the layer reaches 0.2 μm, and the brightness of the LED 110. As shown in FIG. 3A and FIG. 3B, when a growth rate is equal to or less than 1.2 μm/h, a number of hillocks is equal to or less than 5,000 (piece/cm$^2$) and the brightness thereof is equal to or more than 1.8 cd corresponding to 90% of 2.0 cd.

Figure 4A:
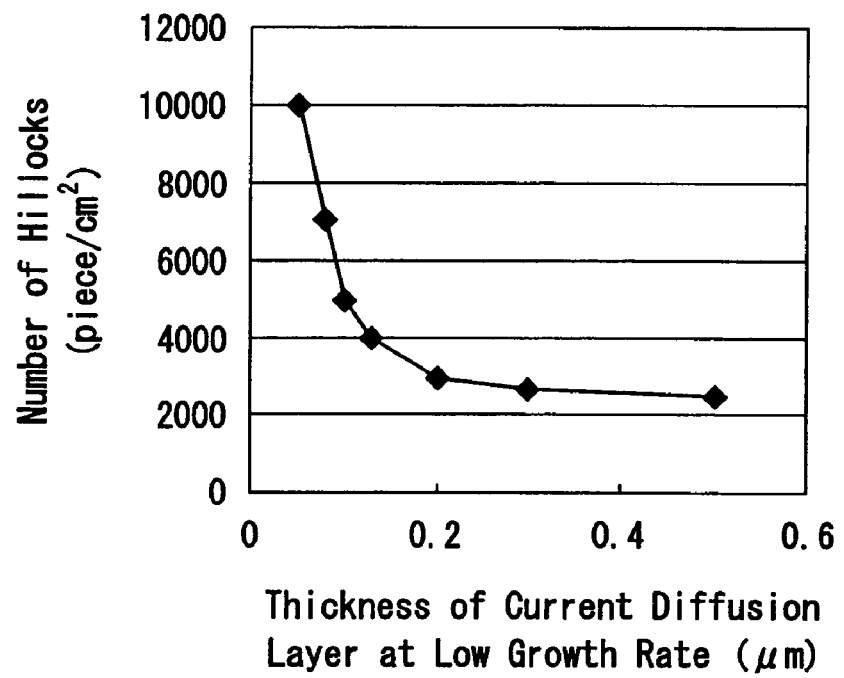
FIG. 4A is a graph showing a relation between the thickness of the current diffusion layer which is formed at a low growth rate, and the number of hillocks.
Figure 4B:
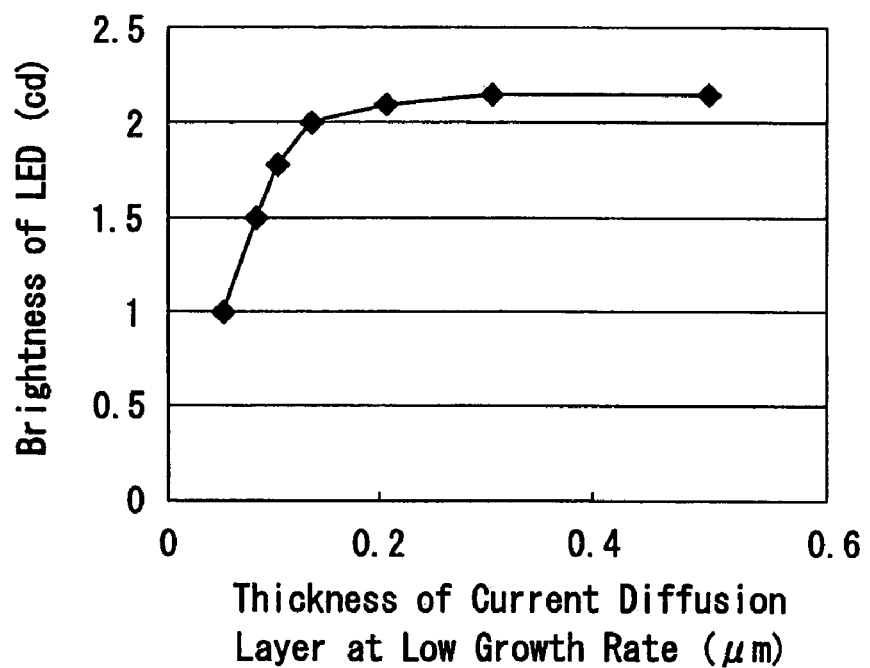
FIG. 4B is a graph showing a relationship of the thickness of the current diffusion layer which is grew with low speed and the brightness of the LED thereof.

FIG. 4A is a graph showing a relation between the thickness (μm) of the current diffusion layer 7 and the number of hillocks (piece/cm$^2$), when the growth rate of the current diffusion layer 7 is low, i.e. 0.8 μm/h. FIG. 4B is a graph showing a relation between the thickness (μm) of the current diffusion layer 7 and the brightness (cd) of the LED 110, when the growth rate of the current diffusion layer 7 is low, i.e. 0.8 μm/h. As shown in FIG. 4A and FIG. 4B, in order to make the number of hillocks equal to or less than 5,000 (piece/cm$^2$) and in order to make the brightness of the LED 100 equal to or more than 1.8 cd, it is necessary that a thickness of the current diffusion layer 7 must be formed more than 0.1 μm. This seems to be because the crystallization of the current diffusion layer 7 is incomplete in case that the thickness of the current diffusion layer 7 is equal to or less than 0.1 μm, namely, because the crystallization of the current diffusion layer 7 can not formed fully as the thickness of the layer 7 increases from its initial phase of crystalline growth.

(2) Second Embodiment

Next, with reference to FIGS. 5 through 7B, it is explained about the LED 120 according to the second embodiment. The same components of the LED as those of the LED 100 (see FIG. 10) according to the aforementioned conventional art, are designated by the same reference numerals.

Figure 5:
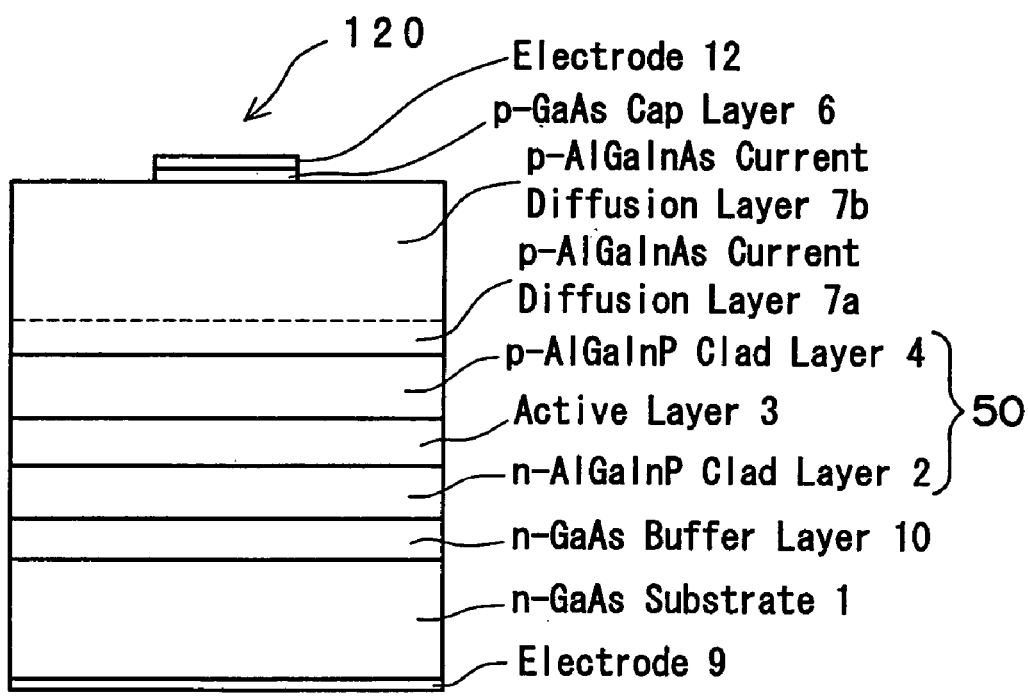
FIG. 5 is a schematic diagram view showing a structure of the LED according to a second embodiment of the present invention.

FIG. 5 is a schematic diagram view showing a structure of the LED 120. At first, by using of MOCVD method, an n-GaAs buffer layer 10 (thickness of 0.5 μm, Si dope: 5×10$^{17}$ cm$^{-3}$), an n-(Al$_{0.7}$Ga$_{0.3}$)$_{0.5}$In$_{0.5}$P clad layer 2 (thickness of 1.0 μm, Si dope: 5×10$^{17}$ cm$^{-3}$), an n-(Al$_{0.3}$Ga$_{0.7}$)$_{0.5}$In$_{0.5}$P active layer 3 (thickness of 0.6 μm, Si dope: 5×10$^{16}$ cm$^{-3}$), a p-(Al$_{0.7}$Ga$_{0.3}$)$_{0.5}$In$_{0.5}$P clad layer 4 (thickness of 0.7 μm, Zn dope: 5×10$^{17}$ cm$^{-3}$), a p-AlGaInAs (electric) current diffusion layer 7a (thickness 0.5 μm, Zn dope: 2×10$^{18}$ cm$^{-3}$), a p-AlGaInAs (electric) current diffusion layer 7b (thickness 5.5 μm, Zn dope: 8×10$^{18}$ cm$^{-3}$) and a p-GaAs cap layer 6 (thickness 0.01 μm, Zn dope: 2×10$^{18}$ cm$^{-3}$) are orderly grown on an n-GaAs substrate 1. A composition ratio (or content) of In of the current diffusion layer 7a and 7b with respect to all the elements belonging to the III group, is set to be 3%.

The n-AlGaInP clad layer 2, the active layer 3 and the p-AlGaInP clad layer 4 constitute the illumination part (or a light emitting part) 50. A PN junction is formed on the active layer 3. A bright light radiates from an electron—hole recoupling phenomenon caused at the PN junction.

Similar to the aforementioned LED 110, the growth rate of the current diffusion layer 7a is set to be 1 μm/h until the thickness of the layer 7a reaches 0.13 μm from the beginning of its growth; and the growth rate of the current diffusion layers 7a is set to be 2 mm/h until the thickness of the layer 7a reaches 0.37 μm after once the thickness thereof has reached the above 0.13 μm; and the growth rate of the current diffusion layer 7b is set to be 2 μm/h from the beginning of its growth.

Also, the electrode 9 is formed on the n-GaAs substrate 1, and the electrode 12 is formed on the p-GaAs cap layer 6, respectively. Then the outer region of a central circle portion (approximately φ=100 μm) of each of the electrode 12 and the p-GaAs cap layer 6 is removed by etching method for making bonding pad.

The number of the hillocks of the LED 120 manufactured by taking the above steps, is reduced to 3,600 (piece/cm$^2$), the value of which is 10% less than that of the LED 110 of the first embodiment.

When a (electric) current of 20 mA is supplied to the LED 120 molded in a cylindrical plastic package (diameter of 5 mm), the LED 120 emits a bright light at 2.2 cd, the value of which is 2.2 times as high as that of the LED 100 according to the first conventional embodiment.

It seems to be the reason of the improving of the LED 120, which is the reducing of the number of hillocks and the enhancement of brightness of the LED 120, that the carrier density rate of the lower portion of the current diffusion layer 7a is set to be lower than that of the upper portion of the current diffusion layer 7b.

Figure 6A:
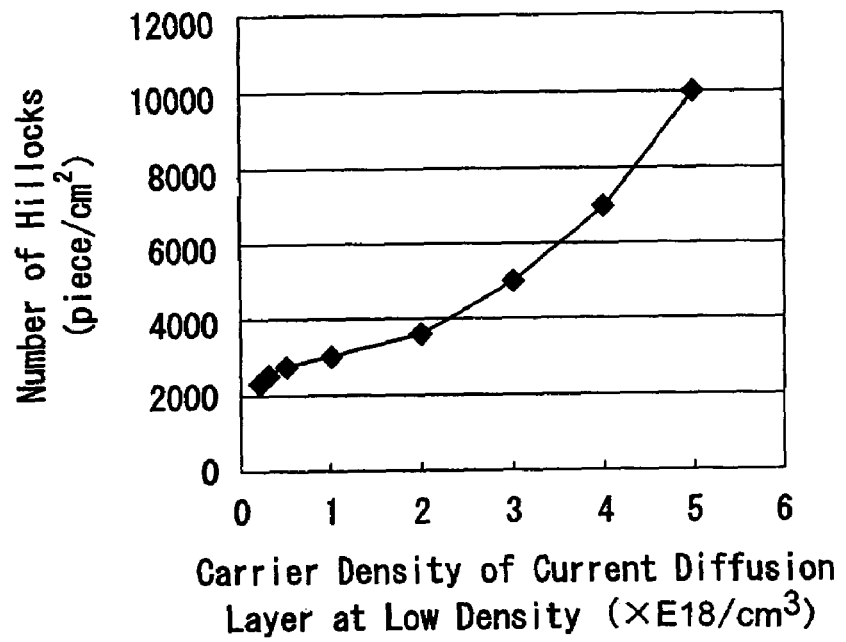
FIG. 6A is a graph showing a relation between the carrier density of the current diffusion layer, at a low density layer, of the LED of FIG. 5 and the number of hillocks.
Figure 6B:
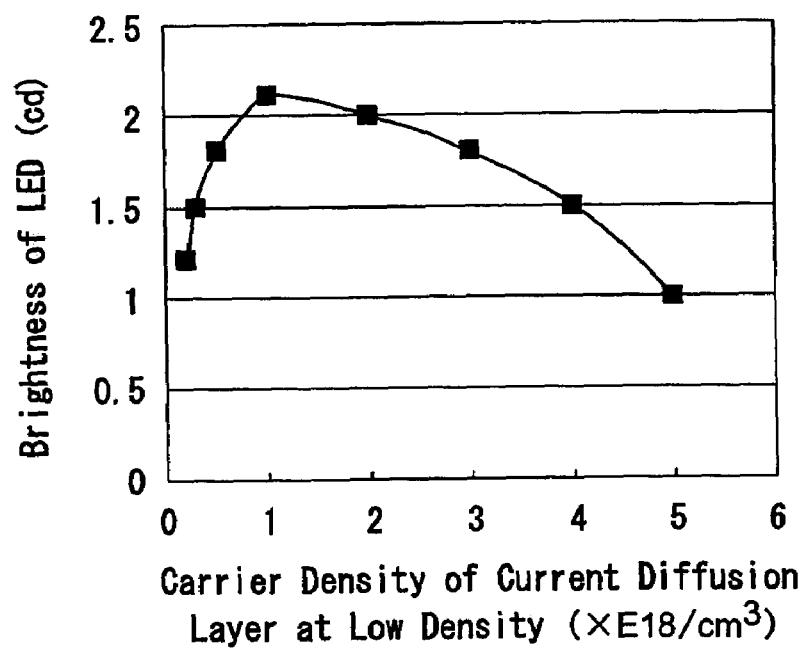
FIG. 6B is a graph showing a relation of the carrier density of the low density layer and the value of a brightness of the LED.

FIG. 6A is a graph showing a relation between the carrier density of the current diffusion layer 7a as a low density layer, located under the current diffusion layer 7b, and the number of hillocks (piece/cm$^2$), in case that the carrier density of the current diffusion layer 7b is fixed to 8×10$^{18}$ cm$^{-3}$. FIG. 6B is a graph showing a relation between the carrier density of the current diffusion layer 7a as a low density layer, located under the current diffusion layer 7b and the brightness of the LED 120, in case that the carrier density of the current diffusion layer 7b is fixed to 8×10$^{18}$ cm$^{-3}$. As shown in FIG. 6A and FIG. 6B, it is to be note that the number of the hillocks is equal to or less than 5,000 (piece/cm$^2$) and that the brightness of the LED 120 is equal to or more than a predetermined value of 1.8 cd, in case that the carrier density of the lower current diffusion layer 7a is in a region from 0.5×10$^{18}$ to 3×10$^{18}$ cm$^{-3}$.

The brightness of the LED 120 tends to decrease when the LED 120 is heated due to its circuit resistance. The lower limit of the carrier density of the lower portion of the current diffusion layer 7a is set to be threshold values that may cause the heating thereof due to its circuit resistance and as may reduce the value of the brightness of the LED 120 to a value equal to or less than 1.8 cd, if the value is further lowered. Also, the value of the upper limit of the carrier density of the lower portion of the current diffusion layer 7a is set to be a threshold value that may deteriorate the crystallization of the current diffusion layer 7a and may make the number of hillocks exceed than 5,000 (piece/cm$^2$) because of the diffusion of In from the p-AlGaInP clad layer 4, if the carrier density of the lower portion of the current diffusion layer 7a further increased.

Figure 7A:
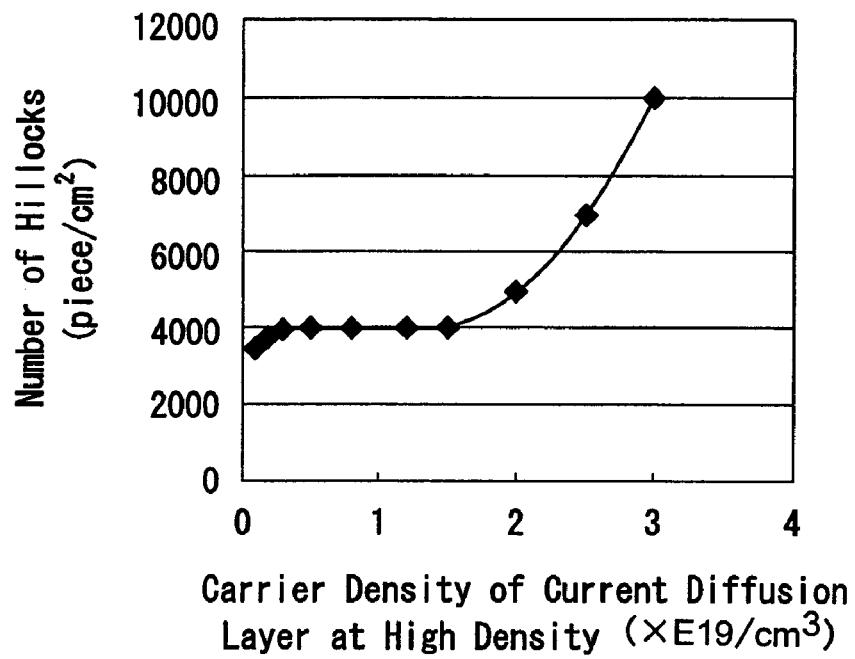
FIG. 7A is a graph showing a relation between the carrier density of the current diffusion layer, at a high density, of the LED of FIG. 5, and the number of hillocks.
Figure 7B:
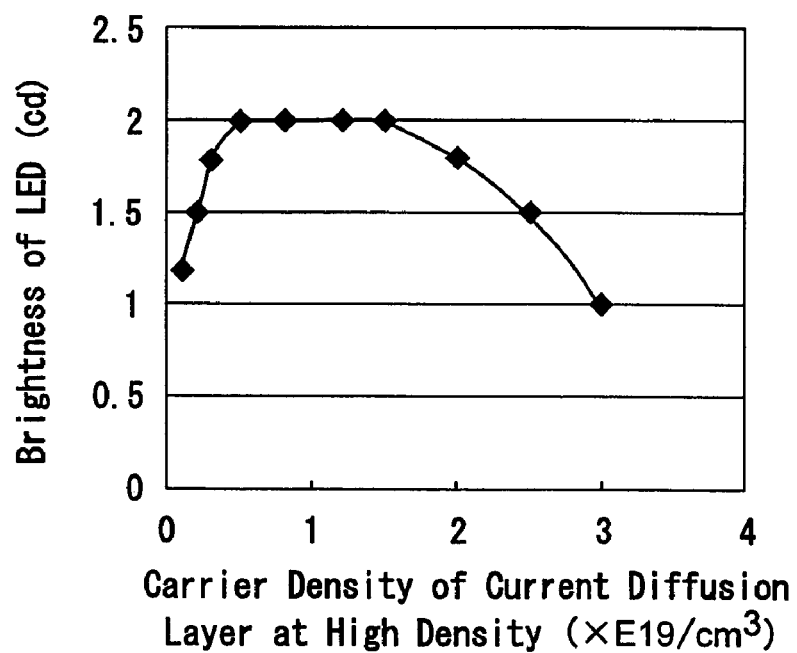
FIG. 7B is a graph showing a relation between the density of the current diffusion layer of the LED of FIG. 5, and the number of hillocks.

FIG. 7A is a graph showing a relation between the carrier density of the current diffusion layer 7b as a high density layer, locating on the current diffusion layer 7a, and the number of hillocks, when the carrier density of the current diffusion layer 7a is fixed at 2×10$^{18}$ cm$^{-3}$. FIG. 7B is a graph showing a relation between the carrier density of the current diffusion layer 7b as a high density layer, locating on the current diffusion layer 7a, and the brightness of the LED 120, when the carrier density of the current diffusion layer 7a is fixed at 2×10$^{18}$ cm$^{-3}$. As shown in FIG. 7A and FIG. 7B, when a carrier density of the current diffusion layer 7b is in a region from 0.3×10$^{19}$ to 2×10$^{19}$ cm$^{-3}$, the number of hillocks can be set equal to or less 5,000 (piece/cm$^2$) and the brightness of the LED 120 is equal to or more than a predetermined value of 1.8 cd.

The brightness of the LED 120 tends to decrease when a (electric) current diffusibility comes to bad, so the lower limit of the carrier density of the current diffusion layer 7b is set to be threshold values that can be hold the light intensity of emission at a value equal to or less than 1.8 cd, if the carrier density of the current diffusion layer 7b further lowered. Also, the number of hillocks tend to increase when the carrier density is increased too much, so the upper limit of the carrier density of the current diffusion layer 7b is set to be a threshold value that can be hold the number of hillocks, which is generated inside the upper portion of the current diffusion layer 7b itself, less than 5,000 (piece/cm$^2$), if the carrier density of the upper portion of the current diffusion layer 7a further increased.

(3) Third Embodiment

Figure 8:
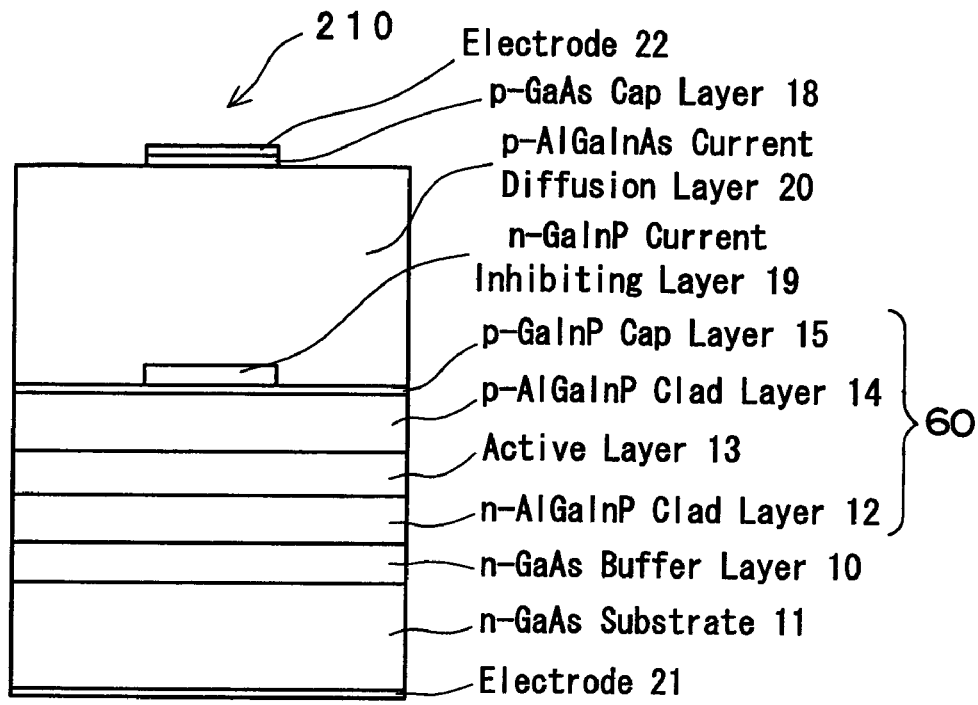
FIG. 8 is a schematic view showing a structure of the LED according to a third embodiment of present invention.

Next, FIG. 8 is a cross-sectional view showing the LED 210 of the third embodiment. It should be noted the same reference numerals designate same parts of the LED 200 (see FIG. 11), which is one of the conventional embodiment, throughout the drawings.

The LED 210 is manufactured by taking the following steps. At first, by using of MOCVD method, an n-GaAs buffer layer 10 (thickness of 0.5 μm, Si dope: 5×10$^{17}$ cm$^{-3}$), an n-$(Al_{0.7}Ga_{0.3})_{0.5}In_{0.5}P$ clad layer 12 (thickness of 1.0 μm, Si dope: 5×10$^{17}$ cm$^{-3}$), an undope $(Al_{0.3}Ga_{0.7})_{0.5}In_{0.5}P$ active layer 13 (thickness of 0.6 μm), a p-$(Al_{0.7}Ga_{0.3})_{0.5}In_{0.5}P$ clad layer 14 (thickness of 0.7 μm, Zn dope: 5×10$^{17}$ cm$^{-3}$), a p-GaInP cap layer 15 (thickness of 0.05 μm, Zn dope: 1×10$^{18}$ cm$^{-3}$) and an n-GaInP (electric) current inhibiting layer 19, are orderly grown on an n-GaAs substrate 11. After the outer region of a central circle portion of the current diffusion layer 19 is removed by etching method, a p-AlGaInAs (electric) current diffusion layer 20 (thickness of 6 μm, Zn dope: 3×10$^{18}$ cm$^{-3}$) and a p-GaAs cap layer 18 (thickness of 0.01 μm, Zn dope: 2×10$^{18}$ cm$^{-3}$) are formed on the p-GaInP cap layer 15. The composition rate of In of the current diffusion layer 20 with respect to all of III group, is set to be 5%.

The n-AlGaInP clad layer 12, the active layer 13, the p-AlGaInP clad layer 14 and the p-GaInP cap layer 15 constitute an illumination part (or the light emitting part) 60.

Also, an electrode 21 is formed on all surface of the substrate 11, and an electrode 22 is formed on a p-GaAs cap layer 18 which is a growth layer. The outer region of a central circle portion (φ=100) both of the p-GaAs cap layer 18 and the electrode 22 is removed by etching method. The central circle portion of the electrode 22 is used for a bonding-pad.

In accordance with the LED 210 of this third embodiment, the current inhibiting layer 19 is made from n-GaInP, in contrast with the LED 200 of the second conventional embodiment of which the current inhibiting layer 16 is made from n-AlGaInP. In case that the p-AlGaInAs current diffusion layer 20 is formed by re-growth method, the surface of the layer 20 are easily oxidized so that the crystallization of the current diffusion layer 20 comes to be incompletely and the number of hillocks tend to be increased (beyond 10,000 (piece/cm$^2$)), that is the reason why the n-AlGaInP current diffusion layer includes Al.

The structure of the LED 210 can reduce the number of hillocks on the surface of the wafer to 4,000 (piece/cm$^2$) the number of which is equal to 10% of the number of the hillocks of the LED 200 of the second conventional embodiment. Also, the composition rate of In of which the first generated layer 20 included, when the thickness of the layer 20 has reached 0.1 μm, is 5.2%, which is an approximately predetermined value. From this fact, it is understandable that the diffusion of In from the clad layer 14 is effectively inhibited. When a (electric) current of 20 mA is supplied to the LED 210 molded by a cylindrical plastic package (diameter of 5 mm), the LED 210 emits bright light at 3.6 candela, the value of which is about twice as good as a value of the LED 200 of the second conventional embodiment.

(4) Forth Embodiment

Figure 9:
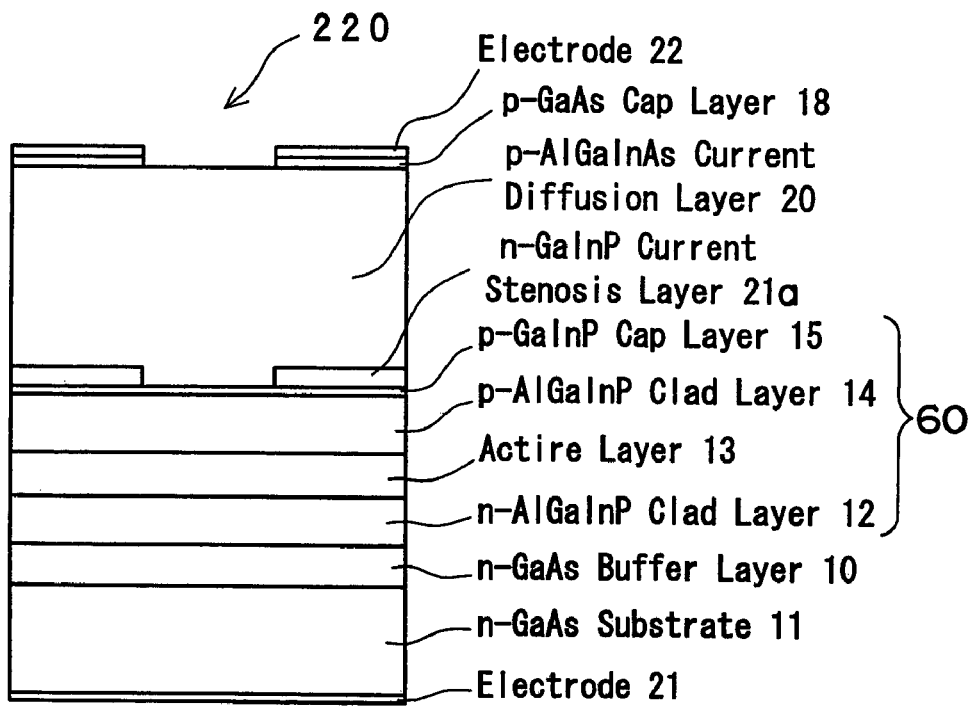
FIG. 9 is a schematic view showing a structure of the LED according to a fourth embodiment of the present invention.

FIG. 9 is a cross-sectional view showing a LED 220 of the forth embodiment. The LED 220 is manufactured by taking the following steps. At first, by using of MOCVD method, an n-GaAs buffer layer 10 (thickness of 0.5 μm, Si dope: 5×10$^{17}$ cm$^{-3}$), an n-$(Al_{0.7}Ga_{0.3})_{0.5}In_{0.5}P$ clad layer 12 (thickness of 1.0 μm, Si dope: 5×10$^{17}$ cm$^{-3}$), an undope $(Al_{0.3}Ga_{0.7})_{0.5}In_{0.5}P$ active layer 13 (thickness of 0.6 mm), a p-$(Al_{0.7}Ga_{0.3})_{0.5}In_{0.5}P$ clad layer 14 (thickness of 0.7 μm, Zn dope: 5×10$^{17}$ cm$^{-3}$), a p-GaInP cap layer 15 (thickness of 0.05 μm, Zn dope: 1×10$^{18}$ cm$^{-3}$) and a n-GaInP (electric) current stenosis layer 21a, are orderly grown on an n-GaAs substrate 11. After a central circle portion of the current stenosis layer 21a is removed by etching method, A p-AlGaInAs (electric) current diffusion layer 20 (thickness of 6 μm, Zn dope: 3×10$^{18}$ cm$^{-3}$) and a p-GaAs cap layer 18 (thickness of 0.01 μm, Zn dope: 2×10$^{18}$ cm$^{-3}$), are orderly grown on the p-GaInP cap layer 15 and the current stenosis layer 21a. An In composition rate of the current diffusion layer 20 with respect to all the elements of the III group, is set to be 8%.

The n-AlGaInP clad layer 12, the active layer 13, the p-AlGaInP clad layer 14 and the p-GaInP cap layer 15 constitute an illumination part (or the light emitting part) 60.

Also, an electrode 21 is formed on all surface of the substrate 11, and an electrode 22 is formed on the p-GaAs cap layer 18 which is a growth layer. The center circle portion of both of the electrode 22 and the p-GaAs cap layer 18 is removed by etching method so that the diameter and center point of both open circular portions of the electrode 22 and the layer 18 is set the same diameter and the same center point of the open circular portion of the current stenosis layer 21a. The number of hillock of the LED 220 on the surface of the wafer is 4,000 (piece/cm$^2$) the number of which is equal to the number of the hillocks of the LED 210 of the third conventional embodiment.

When the current of 20 mA is supplied to the LED 220 molded by a cylindrical plastic package (diameter of 5 mm), the LED 220 emits bright light at 5.4 candela, the value of which is three times as good as a value of the LED 200 of the second conventional embodiment.

Each of the LED 110, 120, 210 and 220 according to first to fourth embodiments has the p-AlGaInAs current diffusion layer which includes In, so that the diffusion of In from the p-AlGaInAs clad layer effectively inhibited, the number of hillocks can set one-tenth of the number of hillocks in the LED 200 according to the conventional embodiment, and the brightness of each of the LED 110, 120, 210 and 220 can set the twice or more value higher than that of the LED 200 according to the conventional embodiment.

Although the present invention has been fully described in connection with the preferred embodiments thereof with reference to the accompanying drawings, it is to be note that various other changes and modifications are also apparent to those skilled in the art. These changes or modifications can be understood as included with the scope of the present inventions as described above specifications and appended claims unless they depart therefrom.

The invention claimed is:

1. A method for manufacturing a light emitting diode having a light emitting part of an AlGaInP type, the method comprising forming a current diffusion layer made of AlGaInAs on a light emitting side of the light emitting part, wherein a composition rate of In in the AlGaInAs to all elements belonging to III group is in a range of 1-10%.

2. The method as claimed in claim 1, wherein the current diffusion layer is formed at a growth rate which is not more than 1.2 μm/h, at least in an initial stage of the forming.

3. The method as claimed in claim 2, wherein the current diffusion layer is formed at a growth rate which is not more than 1.2 μm/h, until a thickness of the current diffusion layer comes to over 0.1 μm.

* * * * *